(12) United States Patent
Strömer et al.

(10) Patent No.: US 9,882,170 B2
(45) Date of Patent: Jan. 30, 2018

(54) ORGANIC LIGHT EMITTING DEVICE WITH IMPROVED LIGHT EXTRACTION

(75) Inventors: Jan Frank Strömer, Frankfurt am Main (DE); Marcus Antonius Verschuuren, Frankfurt am Main (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 23 days.

(21) Appl. No.: 14/118,280

(22) PCT Filed: May 23, 2012

(86) PCT No.: PCT/IB2012/052584
§ 371 (c)(1),
(2), (4) Date: Mar. 4, 2014

(87) PCT Pub. No.: WO2012/160522
PCT Pub. Date: Nov. 29, 2012

(65) Prior Publication Data
US 2014/0197390 A1    Jul. 17, 2014

(30) Foreign Application Priority Data
May 25, 2011    (EP) .................................... 11167464

(51) Int. Cl.
*H01L 29/80*    (2006.01)
*H01L 51/52*    (2006.01)
*H01L 51/56*    (2006.01)

(52) U.S. Cl.
CPC .......... *H01L 51/5275* (2013.01); *H01L 51/56* (2013.01)

(58) Field of Classification Search
CPC .... H01L 50/0545; H01L 33/00; H01L 27/288
(Continued)

(56) References Cited

U.S. PATENT DOCUMENTS

| 7,417,370 B2 | 8/2008 | Cok et al. |
| 7,872,414 B2 | 1/2011 | Sugita et al. |

(Continued)

FOREIGN PATENT DOCUMENTS

| EP | 1615472 A1 | 1/2006 |
| JP | 2004281080 A | 10/2004 |

(Continued)

OTHER PUBLICATIONS

Michael Slootsky et al; "Full-Wave Simulation of Enhanced Outcoupling of Organic Light-Emitting Devices With an Embedded Low-Index Grid", Applied Physics Letter, vol. 94, 163302, 2009, pp. 1-3.

(Continued)

*Primary Examiner* — Cuong Q Nguyen
*Assistant Examiner* — Nishath Yasmeen

(57) ABSTRACT

The invention provides an organic light-emitting device (OLED) comprising: a transparent substrate; a first, transparent electrode layer arranged on said substrate; one or more organic light-active layers arranged on said first electrode layer; a second electrode layer arranged on said one or more organic light-active layers; and a discontinuous layer comprising discrete, randomly distributed nanometer-sized domains of a low refractive index material, arranged between said first electrode layer and said one or more organic light-active layers. The discontinuous layer of discrete, randomly distributed nano-sized domains increases the light extraction efficiency of the OLED.

16 Claims, 3 Drawing Sheets

(58) Field of Classification Search
USPC .......................................................... 257/40
See application file for complete search history.

(56) References Cited

U.S. PATENT DOCUMENTS

| | | |
|---|---|---|
| 2002/0018620 A1 | 2/2002 | Koyama et al. |
| 2003/0057417 A1 | 3/2003 | Lee et al. |
| 2006/0204865 A1* | 9/2006 | Erchak ............... H01L 33/20 430/7 |
| 2007/0069199 A1* | 3/2007 | Choulis ............... B82Y 20/00 257/40 |
| 2007/0120136 A1* | 5/2007 | Noda ............... H01L 51/5262 257/98 |
| 2008/0205062 A1* | 8/2008 | Dahm ............... F21K 9/00 362/294 |
| 2009/0015757 A1* | 1/2009 | Potts ............... B82Y 20/00 349/69 |
| 2010/0181899 A1 | 7/2010 | Forrest et al. |
| 2011/0080738 A1 | 4/2011 | Wakabayashi et al. |

FOREIGN PATENT DOCUMENTS

| | | |
|---|---|---|
| JP | 2004311419 A | 11/2004 |
| JP | 2005135859 A | 5/2005 |
| JP | 2006236748 A | 9/2006 |
| JP | 2007076207 A | 3/2007 |
| JP | 2007280746 A | 10/2007 |
| JP | 2010248429 A | 11/2010 |
| JP | 2011061025 A | 3/2011 |
| WO | 2003007663 A1 | 1/2003 |
| WO | 2010077521 A2 | 7/2010 |
| WO | WO 2011084661 A2 * | 7/2011 ............... C09D 1/00 |

OTHER PUBLICATIONS

Yiru Sun et al; "Enhanced Light Out-Coupling of Organic Light-Emitting Devices Using Embedded Low-Index Grids", Nature Photonics, vol. 2, Aug. 2008, pp. 483-487. www.nature.com/naturephotonics.

* cited by examiner

ORGANIC LIGHT EMITTING DEVICE WITH IMPROVED LIGHT EXTRACTION

FIELD OF THE INVENTION

The invention relates to organic light emitting diodes (OLEDs), to methods of manufacturing OLEDs, and to luminaires and display devices comprising such OLEDs.

BACKGROUND OF THE INVENTION

Organic light-emitting diodes (OLEDs) are thin film devices in which light is generated by applying a voltage over an organic film. In particular, OLEDs are increasingly used for signage lighting, such as advertising information and indication signs, but their use in flat panel displays, illumination and decorative lighting is also very promising.

In general, an OLED comprises a layer stack comprising an organic layer sandwiched between two electrodes, and optionally one or more organic charge injection or charge transport layers, arranged on a transparent substrate.

For commercialization of OLEDs, device efficiency is an important parameter. The total device efficiency is determined by the internal quantum efficiency and the external quantum efficiency (light outcoupling). In recent years many techniques have been proposed to improve the internal quantum efficiency, including for example doping of transport layers to increase charge recombination, and the use of triplet-emitter by which almost 100% internal quantum efficiency can be achieved. Also to improve the external quantum efficiency numerous techniques have been proposed, including particular stack designs for reducing external quantum efficiency roll-off of triplet-emitters based on reduced triplet-triplet annealing, and by choosing various layers with refractive indices and thicknesses such as to reduce reflection of the emitted light at the layer interfaces and thus reduce the considerable amount of light trapped due to total internal reflection within the organic layers, the electrode layers and/or the substrate layer. However, still as much as 60% of the generated light remains trapped in the organic layer, and about 20% remains trapped in the glass substrate.

In order to increase outcoupling of light trapped within the organic layer and/or the anode ITO layer (also referred to as light in "waveguide mode"), US 2010/018899 (Forrest et al.) proposed the use of a low refractive index grid embedded in the organic material. The outcoupling efficiency of such a device may be up to two to three times the efficiency of a standard OLED.

However, a problem with existing devices is that still, a relatively large portion of light remains trapped in the organic layers or the glass substrate due to total internal refection at layers interfaces, or is absorbed. Hence the need for improvement of the external quantum efficiency in OLEDs remains.

SUMMARY OF THE INVENTION

It is an object of the present invention to overcome this problem, and to provide an OLED with increased light extraction from the organic layers, electrode layer(s) and/or the substrate.

According to a first aspect of the invention, this and other objects are achieved by an organic light-emitting diode (OLED) comprising:
 a transparent substrate;
 a first, transparent electrode layer arranged on said substrate;
 one or more organic light-active layers arranged on said first electrode layer;
 a second electrode layer arranged on said one or more organic light-active layers; and
 a discontinuous layer comprising discrete, randomly distributed nanometer-sized domains of a low refractive index material, arranged between said first electrode layer and said one or more organic light-active layers.

The OLED according to the invention offers increased light extraction efficiency, and thus increased overall efficiency, in particular by enhancing the extraction of light that would otherwise be trapped within the organic layers and/or the electrode layers due to total internal reflection at layer interfaces. Furthermore, the random distribution of the nano-size domains has the advantage that it avoids the diffraction pattern of the emitted light resulting from a regular structure having dimensions in the applicable wavelength range. Hence, a more uniform light output is obtained.

In embodiments of the invention, the low refractive index material may have a refractive index of less than 1.8, such as in the range of 1.0 to 1.8, and preferably 1.0 to 1.4. This is sufficiently low to ensure good light extraction.

In embodiments of the invention the discrete, randomly distributed domains may have an average width in the range of 1 to 500 nm, for example about 100 nm. The average distance between two adjacent domains may be 1 µm or less. In embodiments of the invention, the discrete, randomly distributed domains may be pillar-like structures, typically having a substantially circular circumference.

As mentioned above, the discontinuous layer comprising discrete, randomly distributed domains of a low refractive index material typically increases the extraction of light from the electrode layer and/or the organic layer into said substrate, from which it may subsequently exit the device.

In embodiments of the invention, a further light outcoupling structure may be provided on the substrate layer, typically on a side thereof facing away from the rest of the device layers.

In embodiments of the invention, the first electrode layer may be a transparent anode layer. According to other embodiments, the first electrode layer may be a transparent cathode layer. Furthermore, in yet other embodiments of the invention, also the second electrode may be transparent, thus forming a transparent OLED.

In a second aspect, the invention provides a luminaire comprising an OLED as described herein. Since an OLED provides a light emitting surface, and may be very thin and even flexible, OLED based luminaires and are particularly suitable for decorative interior lighting.

In another aspect, the invention provides a display device comprising an OLED as described herein. Typically a display device comprises a plurality of OLEDs. OLED display panels may be made very thin, since they do not require backlight, and may provide high contrast images.

In a further aspect, the invention provides a method of manufacturing an organic light-emitting diode, comprising the steps of:
 providing a substrate;
 depositing a first electrode layer over said substrate;

depositing discrete domains of a low refractive index material in a random pattern to form a discontinuous layer on said first electrode layer;

depositing one or more organic light-active layers on said discontinuous layer; and depositing a second electrode layer on said one or more organic light-active layers.

In particular, the step of depositing discrete domains of a low refractive index material to form a discontinuous layer may be performed by forming a continuous layer of said low index material; imprinting a pattern into said layer of low index material; and removing excess low index material to form a discontinuous layer comprising discrete domains.

It is noted that the invention relates to all possible combinations of features recited in the claims.

BRIEF DESCRIPTION OF THE DRAWINGS

These and other aspects of the present invention will now be described in more detail, with reference to the appended drawings showing embodiment(s) of the invention.

DETAILED DESCRIPTION

The present inventors found that a discontinuous layer comprising discrete domains, or pillars, of a low refractive index material arranged between the anode and the organic layers of an OLED considerably increased extraction of light from the organic layer(s) and/or the anode.

In this context, "low refractive index material" means a material having a refractive index (with respect to visible light) which is lower than the refractive index of the organic layers and the adjacent electrode layer. The organic layers of an OLED generally have a refractive index $n_{org}$ in the range of 1.75-1.85, and an ITO electrode typically has a refractive index $n_{ITO}$ of about 1.9. The substrate may have a refractive index of about 1.5 (typical for a glass substrate). The low refractive index material forming the discrete domains may have a refractive index that is lower than 1.5, typically in the range of 1.0 to about 1.4, for example 1.0 to less than 1.4.

Light that is confined to the organic layers(s) and the first electrode layer due to total internal reflection at the interfaces with adjacent layers of lower refractive index, may be referred to as light in "waveguide mode" or "organic mode" (although it may enter also the inorganic electrode layer). In contrast, light that is confined to a glass substrate layer may be referred to as light being in "glass mode", and the light eventually outcoupled from the device may be referred to as being in "air mode".

As used herein, "nanometer-sized" or "nano-size" means having dimensions in the nanometer (sub-micrometer) range.

As used herein, "layer" may refer to a continuous or a discontinuous layer, unless stated otherwise. "A layer" does not necessarily mean a single layer, but may refer to a plurality of layers, in particular when referring to the organic layer of an OLED. Typically, an OLED comprises a plurality of organic-based layers, including at least a light-emitting layer but often also one or more charge injection layer(s), charge transport layer(s) and/or charge blocking layer(s).

Figure 1:
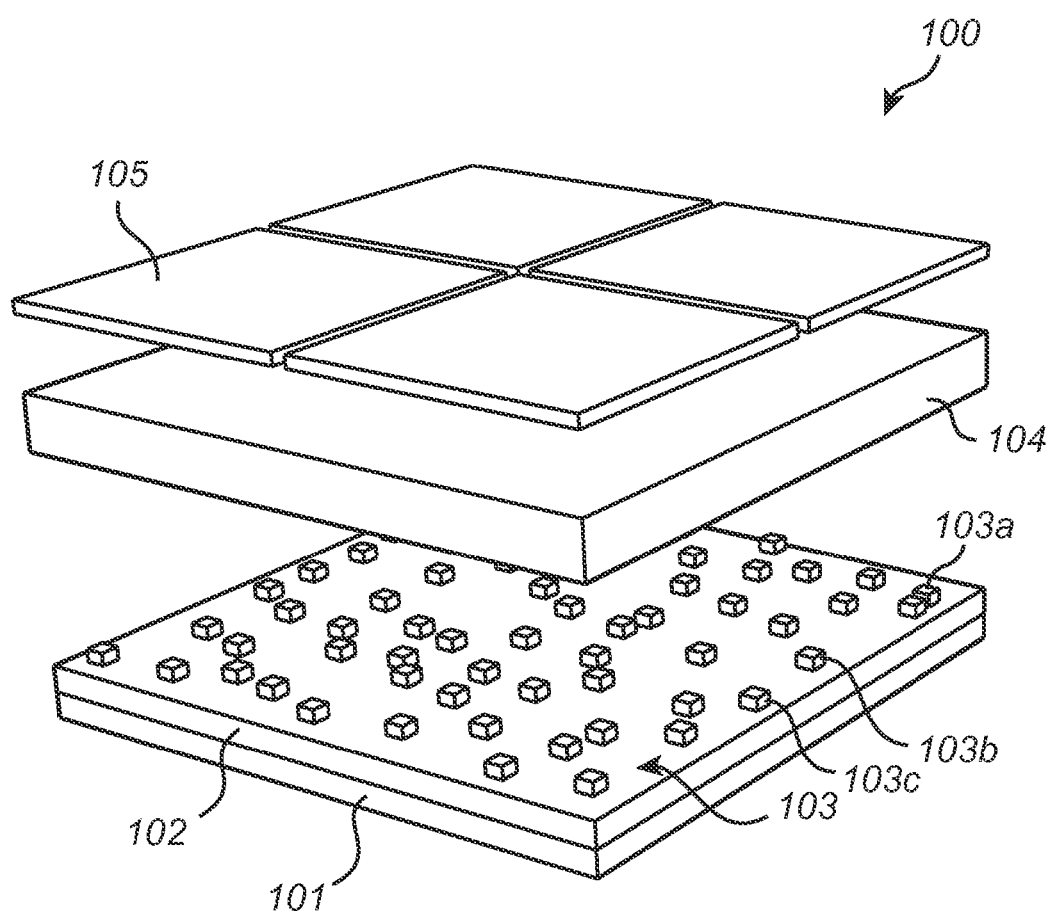
FIG. 1 shows a perspective, partially expanded view of a device according to embodiments of the invention.

FIG. 1 illustrates an OLED according to an embodiment of the present invention seen in a partially expanded perspective view. The OLED 100 comprises a translucent substrate 101 on which is arranged, in this order, a transparent inorganic, preferably metallic, electrode 102, here a transparent ITO layer forming the anode; a discontinuous layer 103 of discrete, randomly or irregularly distributed domains 103a, 103b, 103c etc of low refractive index material; a plurality of organic layers 104; and a second inorganic electrode 105, here a non-transparent metallic electrode forming the cathode.

Figure 2:
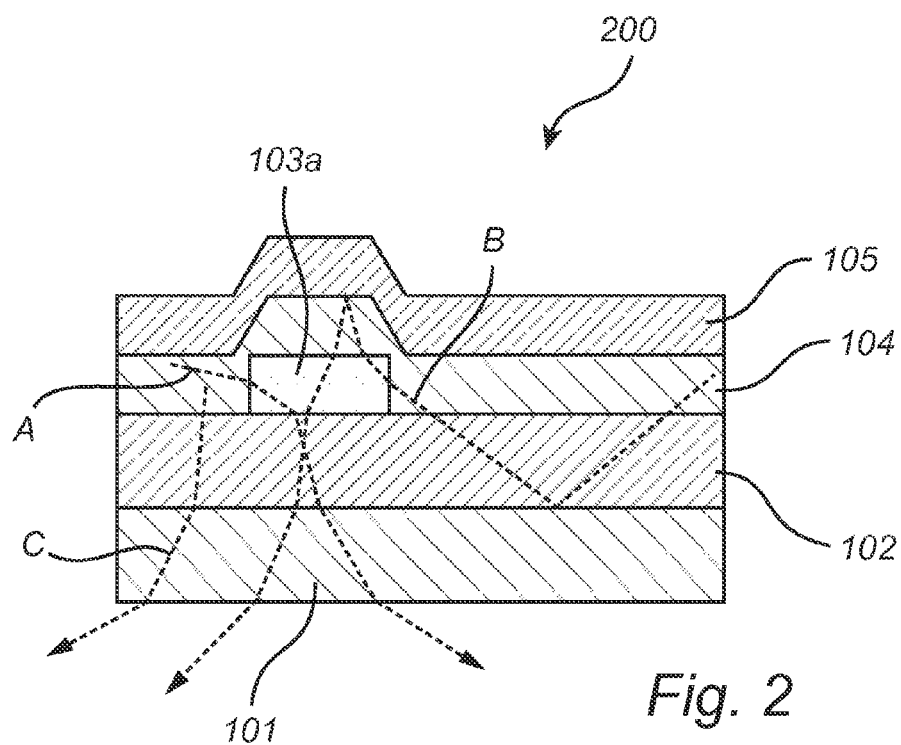
FIG. 2 shows a cross-sectional side view of the device of FIG. 1.

FIG. 2 illustrates part of a cross-sectional side view of the device of FIG. 1 taken through a domain 103a. A ray of light A emitted from the organic layer 104, which would otherwise have been trapped in the organic layer 104 and the anode 102 due to total internal reflection at the ITO-substrate layer interface, is refracted by the domain 103a and is transmitted into the anode layer 102 with an angle closer to the layer normal. The ray of light A is subsequently transmitted into the substrate layer 101 and outcoupled from the device. Another ray of light B also generated by the light-emitting organic layer 104 is first totally internally reflected at the anode-substrate interface and is subsequently refracted by the domain of low refractive material 103a, reenters the organic layer 104 with an angle closer to the layer normal, and is reflected by the reflective cathode 105 such that it can be transmitted through the organic layer 104, the low refractive index domain 103, the electrode 102 and the substrate 101.

Another ray of light C emitted by the organic layer 204 and incident on the organic-ITO layer interface with an angle close to the layer normal is not affected by the presence of the low refractive index domain 103a.

Hence, the domain 103a enables outcoupling of light, that would otherwise be trapped in the organic layer(s) and/or the first electrode layer (i.e., light being in the organic mode), into the substrate 101.

Figure 3:
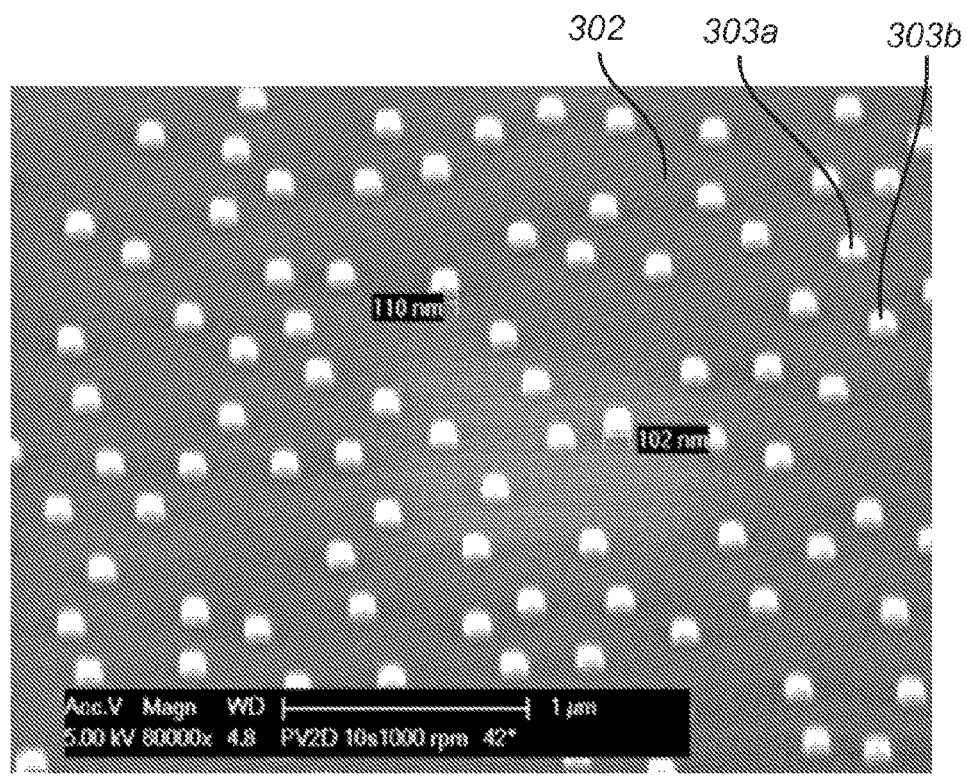
FIG. 3 shows a scanning electron microscopy image of part of a device according to an embodiment of the invention.
Figure 4:
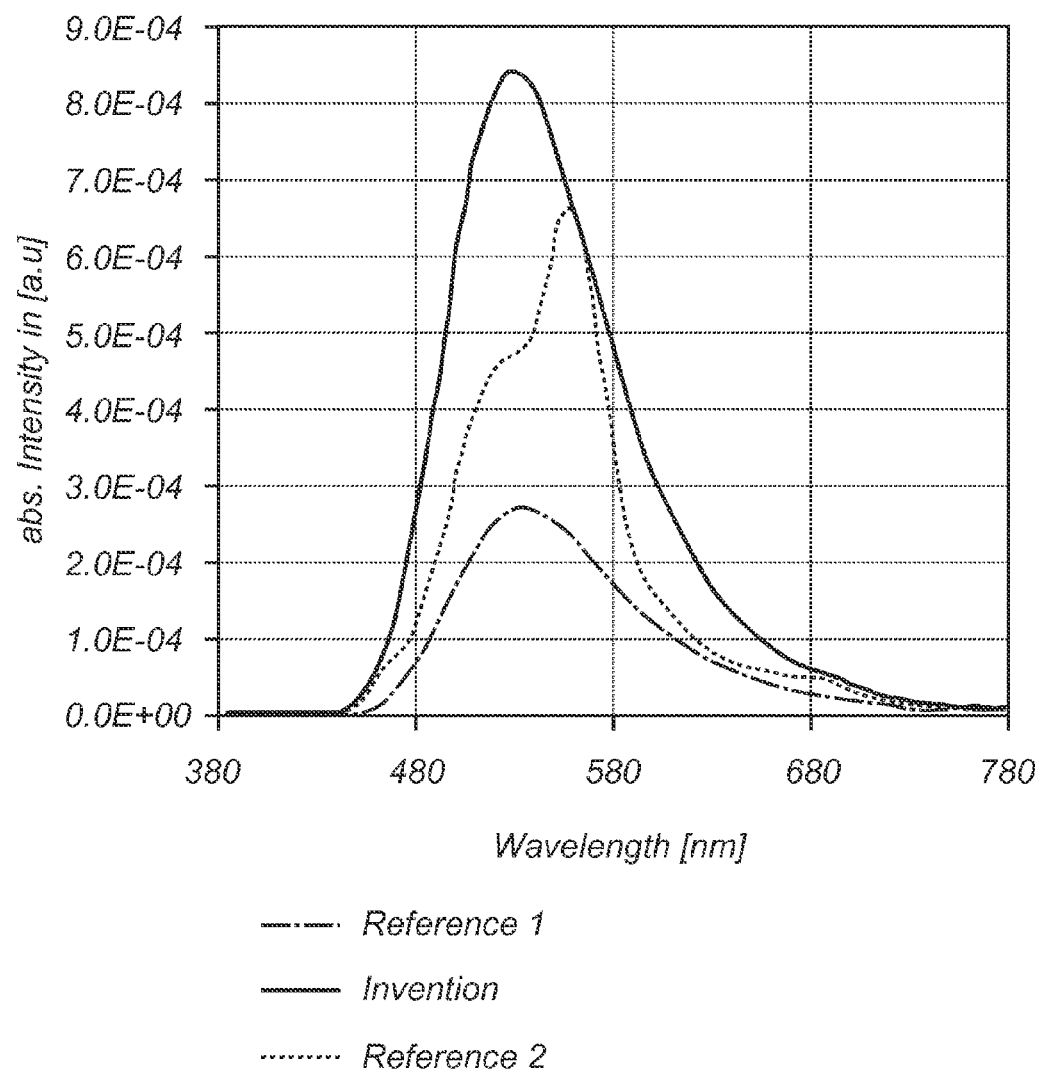
FIG. 4 is a graph showing the intensity distribution of a device according to an embodiment of the invention compared to prior art devices.

FIG. 3 shows a scanning electron microscopy (SEM) image of a part of an OLED according to embodiments of the present invention. An ITO electrode layer 302 is deposited over a substrate (not shown), and discrete, irregularly distributed domains 303a, 303b etc of a low refractive index material are distributed on the ITO layer. The complete device will also comprise one or more organic layers forming the light-active layers deposited over the discontinuous layer formed by domains 303a, 303b, and a second electrode deposited over the organic layer(s).

The domains 103a, 103b,303a, 303b etc are irregularly distributed over the electrode layer. The domains may be randomly distributed, for example as an effect of the method of deposition. The domains may be produced by a nanoimprinting technique. For example, the nano-size domains may be produced from a solgel using a soft stamp as described below.

The domains 103a, 103b, 303a, 303b etc have low refractive index in the visible wavelength range, and typically are comprised of a material which has low refractive index. One example of such a material is a methyltrimetothoxysilane (MTMS), which has a refractive index of 1.37. Another example is fluorine doped silicon nitride (SiN). Preferably, the refractive index of the low index material should be as low as possible, but for all practical purposes a refractive index in the range of less than 1.8 is useful and a refractive index of about 1.4 or lower is considered very acceptable.

The domains 103a typically have no sharp edges that can induce unwanted optical effects, and preferably also has low surface roughness. As suggested above, the domains of low refractive material are transparent, and preferably are non-absorbing with respect to light of the applicable wavelength (typically visible light). Moreover, the low refractive index material used is preferably resistant to commonly used substrate cleaning processes.

The domains 103a may have a height in the range of 10 to 200 nm, for example about 100 nm. The domains 103a, 103b etc may have a width or diameter in the range of 1 to 500 nm, for example 10 to 200 nm, and typically about 100 nm. For example, one of the domains shown in FIG. 3 has a width of 110 nm, and another domain shown in FIG. 3 has a width of 102 nm. The domains 103a, 103b etc are arranged at irregular spaces from each other. Typically, the average distance between two adjacent domains is about 1 μm or less. Preferably, the average distance between two adjacent domains is less than 1 μm, such as 800 nm or less, or 600 nm or less. For larger average distances between adjacent domains the outcoupling effect may decrease.

In this context "about" typically means ±10%.

Using the randomly distributed domains of the invention, diffraction effect in the emission pattern resulting from a regular structure can be avoided. Moreover, the outcoupling efficiency achieved using the domains may be improved compared to that obtained using a regular structure such as a grid.

The number of domains per μm$^2$ (i.e. the domain density) may be in the range of 1 to 100, typically 2 to 50, for example 5 to 10. The smaller the distance between any two adjacent domains, the higher the domain density, resulting in improved light extraction.

In embodiments of the invention, the substrate 101 may comprise light extracting structures, such as microlenses or prisms, in order to further improve the light outcoupling efficiency by increasing the extraction of light from the substrate layer (glass mode light).

The OLED according to the invention may be manufactured by depositing a first electrode layer onto a substrate; depositing discrete domains of a low refractive index material to form a discontinuous layer on said first electrode layer; depositing one or more organic light-active layers on said discontinuous layer; and depositing a second electrode layer on said one or more organic light-active layers. Deposition of the first electrode layer, the organic layer(s) and the second electrode may be performed using known techniques. The organic layers are typically deposited directly onto the discontinuous layer of discrete domains.

The discontinuous layer 103 of discrete domains 103a, 103b etc is located between the first electrode layer and the organic layers in a vertical direction (normal to the layer plane). Typically, no other layers except said discontinuous layer 103 are present between the electrode layer and the organic layers. Thus, at areas lacking a domain 103a, (i.e. in the spaces between adjacent domains) the first electrode layer will be in direct contact with the first organic layer, which may be for example a charge injection layer, a charge transport layer or a charge barrier layer. Furthermore, at areas where a domain 103a, 103b etc is present, the first electrode layer will be separated from the organic layers by said domain.

The discontinuous layer of discrete nano-size domains may be produced as follows. A master mold comprising an irregular pattern of domains is made using electron beam writing. A soft and flexible material, typically a polymeric material, such as poly(methyl methacrylate) (PMMA), is then formed into a stamp using the master mold. A continuous layer of low refractive index material, typically in sol-gel form, is applied onto the ITO electrode layer, and the stamp is applied to imprint a pattern into the solgel layer. Next, an etching step is used for removing low refractive index solgel in unwanted areas.

OLEDs according to embodiments of the invention may be used in various lighting devices, for example a luminaire for general lighting, interior lighting and/or decorative lighting. Alternatively, OLEDs according to embodiments of the invention may be used to form the pixels of a display panel. Display panels comprising a plurality of OLEDs according to embodiments of the invention may be integrated in numerous devices, in particular hand-held devices such as mobile telephones including smartphones, handheld computers and game consoles and digital cameras, but also larger devices such as computer screens, TVs, etc, as will be appreciated by the skilled person.

EXAMPLE

A device stack was produced comprising a ITO anode (with refractive index $n_{ITO}$ of about 1.9) deposited onto a glass substrate. Over the anode was applied a α-NPD hole injection/transport layer (with refractive index $n_{\alpha\text{-}NPD}$ of about 1.8), and an Alq3 light emitting layer with refractive index $n_{Alq3}$ of about 1.8, and a cathode layer. Part of the device stack was made the test region by imprinting a nanostructure comprising irregularly distributed nano-sized pillars of a silicon based sol-gel material onto the ITO before deposition of the organic layers. After forming the nanostructure, the organic layers were applied as usual.

As references were used respectively a region of the device stack lacking a light extraction pattern (reference 1), and a region of the device stack having a regular grid pattern instead of nanodomains (reference 2).

The light intensity of the device during operation was measured perpendicular to the light-emitting surface (glass substrate). For the outcoupling efficacy calculations a Lambertian angular light distribution was assumed.

It was observed that the test region of the device offered a large improvement, about 2.7, in light-outcoupling efficacy compared to reference 1, lacking a nanostructure of low index material. The test region visually showed higher light intensity seen from an angle (not perpendicular) to the light-emitting surface.

It was also observed that the test device provides improved light outcoupling efficiency compared to reference 2 which had, instead of the irregularly distributed nano-sized pillars, a regular nanostructure of 400 nm pitch. Furthermore, it was observed that while reference device 2 resulted in losses and shift in of the peak spectrum, the test device did not yield these effects.

The person skilled in the art realizes that the present invention by no means is limited to the preferred embodiments described above. On the contrary, many modifications and variations are possible within the scope of the appended claims. For example, instead of the bottom-emissive OLED described above in connection with FIGS. 1 and 2, the OLED of the present invention may be a top emissive OLED, in which case the first electrode represents the cathode and the second electrode represents the anode. Alternatively, the OLED may be a transparent OLED in which both electrodes are transparent, and in which case the first electrode may represent either the cathode or the anode. It is also envisaged that a second discontinuous layer of nano-size domains as described herein may be arranged between the second electrode and the organic layers, especially in the case of a transparent OLED.

The invention claimed is:

1. An organic light-emitting device (OLED) comprising:
   a transparent substrate;
   a first transparent electrode layer arranged on said substrate;
   one or more organic light-active layers arranged on said first transparent electrode layer;
   a second electrode layer arranged on said one or more organic light-active layers; and
   a discontinuous layer comprising discrete, nanometer-sized domains of a material, wherein said domains are randomly distributed and deposited in a plane of the OLED between said first transparent electrode layer and said one or more organic light-active layers, wherein said domains are in contact with the first transparent electrode layer and wherein a refractive index of said material for visible light is less than 1.4.

2. The OLED according to claim 1, wherein said material is methyltrimetothoxysilane.

3. The OLED according to claim 1, wherein said discrete, randomly distributed domains have an average width in the range of 1 to 500 nm.

4. The OLED according to claim 1, wherein the average distance between two adjacent domains is 1 μm or less.

5. The OLED according to claim 1, wherein said discrete, randomly distributed domains are pillar-like structures.

6. The OLED according to claim 1, wherein said discontinuous layer comprising the nanometer-sized domains of the material increases the extraction of light from the electrode layer into said substrate.

7. The OLED according to claim 1, further comprising a light outcoupling structure provided on said substrate.

8. The OLED according to claim 1, wherein said first transparent electrode layer is a transparent anode layer.

9. The OLED according to claim 1, wherein said first transparent electrode layer is a transparent cathode layer.

10. The OLED according to claim 1, wherein said second electrode layer is transparent.

11. A luminaire comprising an OLED according to claim 1.

12. The OLED according to claim 1, wherein a total number of the domains per $\mu m^2$ is in the range of 1 to 100.

13. The OLED according to claim 1, wherein the domains are in contact with a first organic layer of the one or more organic light-active layers, and wherein the refractive index of said material is lower than a refractive index of said first transparent electrode layer and is lower than a refractive index of said first organic layer.

14. The OLED according to claim 1, wherein said discontinuous layer comprising the nanometer-sized domains of the material increases the extraction of light from the electrode layer and the organic layer into said substrate.

15. The OLED according to claim 1, wherein said discontinuous layer comprising the nanometer-sized domains of the material increases the extraction of light from the organic layer into said substrate.

16. The OLED of claim 1, wherein said discrete, randomly distributed domains have an average width of about 100 nm.

* * * * *